United States Patent
Nishibayashi et al.

(10) Patent No.: US 9,957,640 B2
(45) Date of Patent: May 1, 2018

(54) SINGLE CRYSTAL DIAMOND AND DIAMOND TOOL

(71) Applicants: Sumitomo Electric Industries, Ltd., Osaka-shi (JP); SUMITOMO ELECTRIC HARDMETAL CORP., Itami-shi (JP)

(72) Inventors: Yoshiki Nishibayashi, Itami (JP); Akihiko Ueda, Itami (JP); Hitoshi Sumiya, Itami (JP); Yutaka Kobayashi, Itami (JP); Yuichiro Seki, Itami (JP); Toshiya Takahashi, Itami (JP)

(73) Assignees: Sumitomo Electric Industries, Ltd., Osaka-shi (JP); Sumitomo Electric Hardmetal Corp., Itami-shi (JP)

( * ) Notice: Subject to any disclaimer, the term of this patent is extended or adjusted under 35 U.S.C. 154(b) by 413 days.

(21) Appl. No.: 14/413,175

(22) PCT Filed: Apr. 16, 2014

(86) PCT No.: PCT/JP2014/060795
§ 371 (c)(1),
(2) Date: Jan. 6, 2015

(87) PCT Pub. No.: WO2014/178281
PCT Pub. Date: Nov. 6, 2014

(65) Prior Publication Data
US 2015/0176156 A1    Jun. 25, 2015

(30) Foreign Application Priority Data

Apr. 30, 2013  (JP) ................................. 2013-095362

(51) Int. Cl.
C30B 29/04    (2006.01)
C30B 25/18    (2006.01)
(Continued)

(52) U.S. Cl.
CPC ............ C30B 29/04 (2013.01); C30B 25/186 (2013.01); C30B 25/20 (2013.01); C01B 32/25 (2017.08)

(58) Field of Classification Search
None
See application file for complete search history.

(56) References Cited

U.S. PATENT DOCUMENTS 5,474,021 A * 12/1995 Tsuno ..................... C30B 25/02
117/101
5,478,513 A * 12/1995 Kosky ..................... C23C 16/01
117/920
(Continued)

FOREIGN PATENT DOCUMENTS

CN    1705775 A    12/2005
CN    104603335 A    5/2015
(Continued)

OTHER PUBLICATIONS

Notification of First Office Action in Chinese Patent Application No. 201480001980.5 dated Jul. 5, 2016.
(Continued)

*Primary Examiner* — Guinever S Gregorio
(74) *Attorney, Agent, or Firm* — Venable LLP; Michael A. Sartori; Kerri M. Patterson

(57) ABSTRACT

A single crystal diamond has a surface. In the single crystal diamond, a measurement region is defined in the surface, the measurement region includes a portion exhibiting a transmittance that is highest in the single crystal diamond and a portion exhibiting a transmittance that is lowest in the single crystal diamond, the measurement region has a plurality of square regions that are continuously arranged and each have a side having a length of 0.2 mm, and an average value of transmittances in each of the plurality of square regions is measured, wherein assuming that the average value of the (Continued)

transmittances in one square region is defined as T1 and the average value of the transmittances in another square region adjacent to the one square region is defined as T2, a relation of $((T_1-T_2)/((T_1+T_2)/2)\times100)/0.2 \leq 20$ (%/mm) is satisfied throughout the measurement region.

7 Claims, 3 Drawing Sheets

(51) Int. Cl.
    *C30B 25/20*      (2006.01)
    *C01B 32/25*      (2017.01)

(56) References Cited

U.S. PATENT DOCUMENTS

| | | |
|---|---|---|
| 2004/0229464 A1 | 11/2004 | Godfried et al. |
| 2006/0231015 A1 | 10/2006 | Meguro et al. |
| 2008/0311023 A1 | 12/2008 | Yamamoto et al. |
| 2010/0111812 A1 | 5/2010 | Meguro et al. |
| 2010/0116197 A1 | 5/2010 | Godfried et al. |
| 2015/0191850 A1 | 7/2015 | Nishibayashi et al. |

FOREIGN PATENT DOCUMENTS

| | | |
|---|---|---|
| EP | 2868780 A1 | 5/2015 |
| JP | 2005-162525 A | 6/2005 |
| JP | 2006-507204 A | 3/2006 |
| JP | 2006-315942 A | 11/2006 |
| JP | 2012-111653 A | 6/2012 |
| JP | 2012-111654 A | 6/2012 |
| WO | WO-2014/168053 A1 | 10/2014 |

OTHER PUBLICATIONS

Extended European Search Report in European Patent Application No. 14792151.4, dated Jan. 27, 2016.

International Search Report issued in PCT Application No. PCT/JP2014/060795 dated May 20, 2014.

* cited by examiner

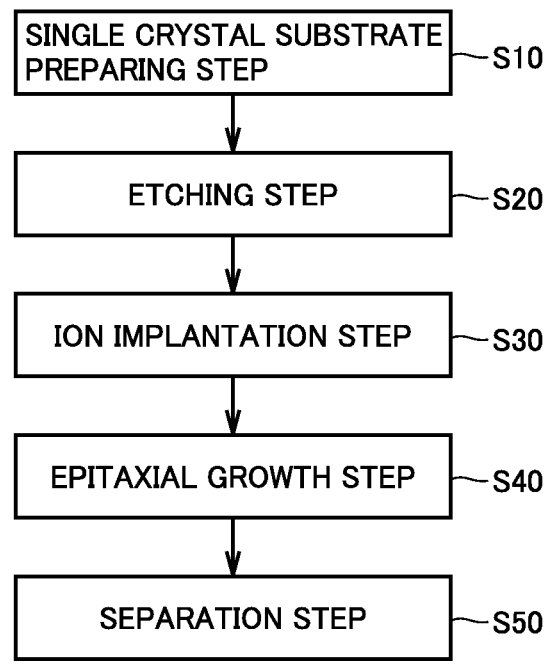
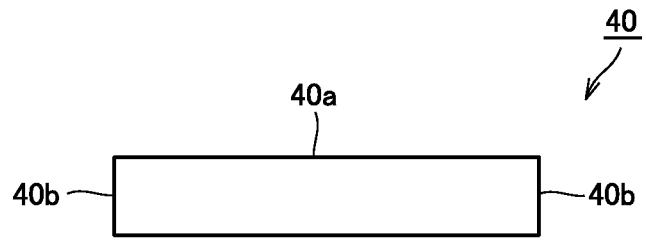

SINGLE CRYSTAL DIAMOND AND DIAMOND TOOL

TECHNICAL FIELD

The present invention relates to a single crystal diamond and a diamond tool, and more particularly to a single crystal diamond allowing an improvement in performance of a diamond tool, and a diamond tool including the single crystal diamond.

BACKGROUND ART

Conventionally, diamond tools such as a cutting tool and a wear-resistant tool have been made using natural diamond or diamond produced by the high pressure high temperature method (HPHT). Natural diamond however exhibits large variations in quality, and cannot be supplied in a constant amount. The diamond produced by the high pressure high temperature method exhibits less variations in quality and can be supplied in a constant amount, but poses a problem that the cost for manufacturing facilities is high.

Another method of synthesizing diamond is a vapor phase synthesis method such as a chemical vapor deposition (CVD) method. For example, Japanese Patent Laying-Open No. 2005-162525 (hereinafter abbreviated as PTD 1) discloses diamond produced by the vapor phase synthesis method, which is transparent in an ultraviolet region and exhibits less crystal defects and strains. Furthermore, for example, Japanese Patent Laying-Open No. 2006-315942 (hereinafter abbreviated as PTD 2) discloses a diamond single crystal used in a semiconductor device substrate and exhibiting less strains. Furthermore, for example, Japanese Patent National Publication No. 2006-507204 (hereinafter abbreviated as PTD 3) discloses a CVD single crystal diamond material that is suitable to be used in an optical device or element.

CITATION LIST

Patent Document

PTD 1: Japanese Patent Laying-Open No. 2005-162525
PTD 2: Japanese Patent Laying-Open No. 2006-315942
PTD 3: Japanese Patent National Publication No. 2006-507204

SUMMARY OF INVENTION

Technical Problem

A single crystal diamond produced by the vapor phase synthesis method as in PTDs 1 to 3 described above poses a problem that, when this single crystal diamond is used in a tool such as a diamond bit, a single crystal material tends to be chipped to cause scratches on a workpiece material. Thus, when the conventional single crystal diamond was used as a material of a diamond tool, it could not sufficiently improve the tool performance. Accordingly, the inventors of the present invention have studied a method of introducing impurities and defects into a crystal for reducing tendencies to cause chipping in a material. As a result of the study, impurities and defects were appropriately introduced into a crystal to thereby prevent spreading of cracks, so that crystal breakage could be suppressed. According to the study of the inventors of the present invention, however, the impurities and defects within a crystal also cause an influence upon the wear rate. Therefore, in the case where impurities and defects are introduced in an uncontrolled manner (where impurities and defects are unevenly distributed), the crystal also exhibits an uneven wear rate. In such a case, there occurred a problem that the tool performance was not sufficiently exhibited and scratches occurred on a workpiece material.

The present invention has been made in light of the above-described problems. An object of the present invention is to provide a single crystal diamond allowing an improvement in performance of a diamond tool, and a diamond tool including the single crystal diamond.

Solution to Problem

A single crystal diamond according to the present invention is a single crystal diamond having a surface. According to the single crystal diamond, a measurement region is defined in the surface, the measurement region has a plurality of first square regions that are continuously arranged and each have a side having a length of 0.2 mm, the measurement region includes a portion exhibiting a transmittance that is highest in the single crystal diamond and a portion exhibiting a transmittance that is lowest in the single crystal diamond, and an average value of the transmittances in each of the plurality of first square regions is measured, wherein assuming that the average value of the transmittances in one first square region of the first square regions is defined as $T_1$ and the average value of the transmittances in another first square region adjacent to the one first square region is defined as $T_2$, a relation of $((T_1-T_2)/((T_1+T_2)/2) \times 100)/0.2 \leq 20$ (%/mm) is satisfied throughout the measurement region.

In this case, the reason why special attention is paid to the transmittance of a single crystal diamond is because the transmittance reflects impurity and defect concentrations within a crystal (that is, a crystal wear rate). Furthermore, since the "transmittance" used herein indicates a value excluding the effect of the reflectance, it shows a value of 100% when no absorption occurs.

The inventors of the present invention have carried out concentrated studies about a single crystal diamond allowing a further improvement in performance of a diamond tool (that is, less likely to cause scratches on a workpiece material). As a result, the inventors have found that the tool performance was improved when using a single crystal diamond into which impurities and defects were introduced in a controlled manner so as to satisfy the above-described relation of $((T_1-T_2)/((T_1+T_2)/2) \times 100)/0.2 \leq 20$ (%/mm) (so as to suppress an abrupt change in the transmittance). Thus, the inventors have conceived of the present invention.

In the single crystal diamond according to the present invention, since the relation of $((T_1-T_2)/((T_1+T_2)/2) \times 100)/0.2 \leq 20$ is satisfied throughout the measurement region, an abrupt change in the transmittance is suppressed. Accordingly, a diamond tool made using the single crystal diamond described above can suppress occurrence of scratches on a workpiece material. Therefore, according to the single crystal diamond of the present invention, by introducing impurities and defects in a controlled manner, it becomes possible to provide a single crystal diamond that allows an improvement in the performance of a diamond tool.

According to the single crystal diamond described above, the first square regions may be arranged continuously in a linear shape in the measurement region. Accordingly, the measurement region can be more readily defined.

According to the single crystal diamond described above, in a case where a second square region having a side having a length of 0.5 mm or 1 mm is defined in the surface, and the transmittances are measured in the second square region, a single peak may exist in a frequency distribution of the transmittances measured in the second square region.

According to the study of the inventors of the present invention, in the single crystal diamond into which impurities and defects are introduced in a controlled manner, a single peak exists in the frequency distribution of the transmittances. Therefore, according to the single crystal diamond in which a single peak exists in the frequency distribution of the transmittances, the performance of a diamond tool can be further improved.

According to the single crystal diamond, the transmittances may be measured in a state where the single crystal diamond is irradiated with light having a wavelength of 550 nm. Furthermore, in the case where the transmittance of light having a wavelength of 550 nm is less than 1%, the transmittances may be measured in a state where the single crystal diamond is irradiated with light having a wavelength of 800 nm. Consequently, the transmittances can be more readily measured.

The single crystal diamond may be formed by a vapor phase synthesis method. As a result, the single crystal diamond having impurities and defects introduced thereinto in a controlled manner can be more readily formed.

The single crystal diamond may be used in a diamond tool. The single crystal diamond allows an improvement in the performance of a diamond tool as described above. Therefore, the single crystal diamond is used in a diamond tool, thereby allowing a further improvement in tool performance.

The diamond tool according to the present invention includes a single crystal diamond according to the present invention that allows an improvement in performance of the diamond tool. Therefore, according to the diamond tool of the present invention, it becomes possible to provide a diamond tool that is more excellent in tool performance.

Advantageous Effects of Invention

As apparent from the description set forth above, according to the single crystal diamond of the present invention, it becomes possible to provide a single crystal diamond allowing an improvement in performance of a diamond tool. Furthermore, according to the diamond tool of the present invention, it becomes possible to provide a diamond tool that is more excellent in tool performance.

BRIEF DESCRIPTION OF DRAWINGS

FIG. 3 is a flowchart schematically showing a method of manufacturing a single crystal diamond according to the present embodiment.

FIG. 4 is a schematic diagram for illustrating the steps (S10) and (S20) in the method of manufacturing a single crystal diamond according to the present embodiment.

DESCRIPTION OF EMBODIMENTS

Figure 1:
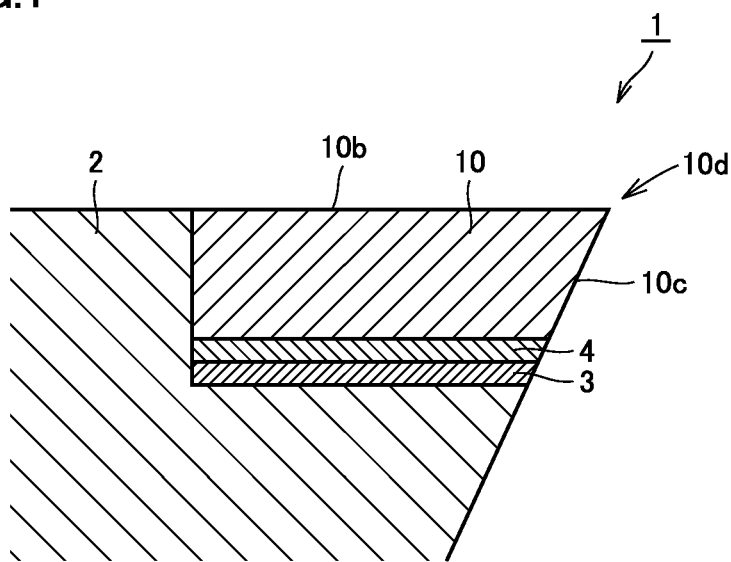
FIG. 1 is a schematic cross-sectional view showing a diamond bit according to the present embodiment.

The embodiments of the present invention will be hereinafter described with reference to the accompanying drawings, in which the same or corresponding components are designated by the same reference characters, and description thereof will not be repeated.

First, a diamond bit 1 will be hereinafter described as an example of a diamond tool according to one embodiment of the present invention. Referring to FIG. 1, diamond bit 1 according to the present embodiment mainly includes a base metal 2, a brazing layer 3, a metallized layer 4, and a single crystal diamond 10.

Single crystal diamond 10 is fixed to base metal 2 through brazing layer 3 and metallized layer 4. Single crystal diamond 10 includes a rake face 10b and a flank face 10c. A cutting edge 10d is formed at a portion where rake face 10b and flank face 10c are in contact with each other. Furthermore, since single crystal diamond 10 is a single crystal diamond according to the present embodiment described later, diamond bit 1 is more excellent in tool performance.

Furthermore, the diamond tool according to the present invention is not limited to diamond bit 1 described above, but for example may be other cutting tools (not shown) such as a drill or an end mill, or may be wear-resistant tools (not shown) such as a dresser, a stylus, a nozzle, or a dice. These cutting tools and wear-resistant tools each are provided with single crystal diamond 10, and therefore, excellent in tool performance like diamond bit 1.

Figure 2:
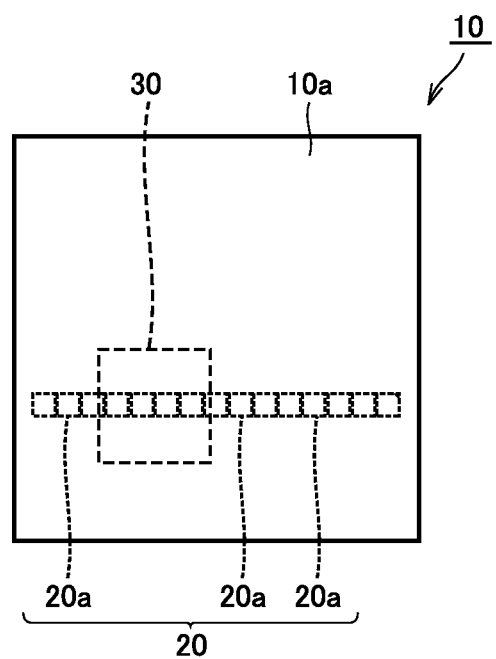
FIG. 2 is a schematic plan view showing a single crystal diamond according to the present embodiment.

Then, single crystal diamond 10 according to the present embodiment will be hereinafter described. Single crystal diamond 10 is used as a material of a diamond tool such as diamond bit 1 described above. Referring to FIG. 2, single crystal diamond 10 is formed by the vapor phase synthesis method such as the microwave plasma CVD method or the hot-filament CVD method, for example, and formed by processing a material, which has a flat plate shape (a square shape, a rectangular shape or an octagonal shape) including a surface 10a, into a shape suitable to a tool.

Impurities such as nitrogen (N) atoms, for example, are introduced into single crystal diamond 10. Also, defects such as strains, atomic vacancies or dislocations are introduced into single crystal diamond 10. The nitrogen atom concentration in single crystal diamond 10 is, for example, 0.00001 atm % or more and 0.01 atm % or less, preferably 0.0001 atm % or more and 0.01 atm % or less, and more preferably 0.001 atm % or more and 0.01 atm % or less. The term "atm %" used herein means the atomic number density of nitrogen in single crystal diamond 10. Furthermore, the nitrogen atom concentration described above shows the total nitrogen amount evaluated by Secondary Ion Mass Spectrometry (SIMS).

The transmittance of single crystal diamond 10 can be measured, for example, as in the following manner. Referring to FIG. 2, a measurement region 20 is first defined in surface 10a of single crystal diamond 10. In this measurement region 20, a plurality of square regions 20a (first square regions) each having a side that is 0.2 mm in length are arranged continuously in a linear shape. This measurement region 20 includes a portion exhibiting a transmittance that is highest in single crystal diamond 10 and a portion exhibiting a transmittance that is lowest in single crystal diamond 10. Then, each of the plurality of square regions 20a is irradiated with light (incident light) having a wavelength of 550 nm from the one main surface side of single crystal diamond 10, and the transmitted light is emitted from the other surface side thereof. Then, based on the ratio of the transmitted light intensity to the incident light intensity, transmittances in each of square regions 20a are measured, and further, an average value of the transmittances can be calculated.

In the case where the transmittances in single crystal diamond 10 are measured as in the manner described above, and assuming that an average value of the transmittances in one square region 20a is defined as $T_1$ and an average value of the transmittances in another square region 20a adjacent to this one square region 20a is defined as $T_2$, the relation of $((T_1-T_2)/((T_1+T_2)/2)\times100)/0.2 \leq 20(\%/mm)$ is satisfied throughout measurement region 20. Preferably, the relation of $((T_1-T_2)/((T_1+T_2)/2)\times100)/0.2 \leq 10$ (%/mm) is satisfied. More preferably, the relation of $((T_1-T_2)/((T_1+T_2)/2)\times100)/0.2 \leq 5$ (%/mm) is satisfied. In the above-described relational expression, $T_1 \geq T_2$.

The above-described indicators show that the tool performance is less influenced by changes in the transmittance as the transmittance is increased while the tool performance is more influenced by changes in the transmittance as the transmittance is decreased. The value of $T_1$ (a value excluding the reflectance) is preferably 80% or less, more preferably 60% or less, further preferably 30% or less, and further more preferably 10% or less. Thus, the less the transmittance is, the more single crystal diamond 10 is suitable for allowing an improvement in the tool performance. On the other hand, $T_1$ needs to be 1% or higher for performing a value evaluation. When $T_1$ is less than 1%, light having a wavelength of 800 nm is used instead for performing an evaluation, thereby allowing a distinction to be made similarly by means of value evaluation.

In this way, in single crystal diamond 10 according to the present embodiment, impurities and defects are introduced in a controlled manner so as to satisfy the relation of $((T_1-T_2)/((T_1+T_2)/2)\times100)/0.2 \leq 20(\%/mm)$ described above (so as to suppress an abrupt change in transmittance). Therefore, the above-described diamond bit 1 made using single crystal diamond 10 is capable of suppressing scratches on a workpiece material, and thus, excellent in tool performance.

Furthermore, the transmittance of single crystal diamond 10 can also be measured as in the following manner. Referring to FIG. 2, a square region 30 (the second square region) having a side having a length of 0.5 mm or 1 mm is first defined in surface 10a of single crystal diamond 10. Then, square region 30 is irradiated with light having a wavelength of 550 nm from the one main surface side of single crystal diamond 10, and then, the transmitted light is emitted from the other surface side thereof. Then, based on the ratio of the transmitted light intensity to the incident light intensity, transmittances in square region 30 are measured, and further, the frequency distribution of the transmittances can be obtained. In this frequency distribution, a plurality of peaks exist in the case of the conventional single crystal diamond, whereas only a single peak exists in the case of single crystal diamond 10 according to the present embodiment.

Then, the method of manufacturing a single crystal diamond according to the present embodiment will be hereinafter described. Referring to FIG. 3, in the method of manufacturing a single crystal diamond according to the present embodiment, the steps (S10) to (S50) are sequentially performed, so that single crystal diamond 10 according to the present embodiment can be produced.

First, a single crystal substrate preparing step is carried out as step (S10). In this step (S10), referring to FIG. 4, a single crystal substrate 40 (type: Ib) having a flat plate shape and made of diamond produced by the high pressure high temperature method is prepared.

Single crystal substrate 40 has a surface 40a including a (100) plane and a side surface 40b including a (001) plane perpendicular to surface 40a. Furthermore, single crystal substrate 40 shows a thickness variation of 10% or less. Furthermore, surface 40a is polished until its surface roughness (Ra) reaches 30 nm or less. It is to be noted that the shape of single crystal substrate 40 may be a square shape, a rectangular shape or an octagonal shape, for example.

Then, an etching step is carried out as step (S20). In this step (S20), referring to FIG. 4, surface 40a is etched by reactive ion etching (RIE), for example, using oxygen ($O_2$) gas and carbon tetrafluoride ($CF_4$) gas. Furthermore, the etching method is not limited to RIE, but may be sputtering, for example, using argon (Ar) gas as main gas.

Figure 5:
FIG. 5 is a schematic diagram for illustrating the step (S30) in the method of manufacturing a single crystal diamond according to the present embodiment.

Then, an ion implantation step is carried out as step (S30). In this step (S30), referring to FIG. 5, carbon (C) ions are implanted into single crystal substrate 40 from the surface 40a side. Consequently, a conductive layer 42 is formed in a region including surface 40a. Furthermore, implanted ions are not limited to carbon ions, but may be nitrogen ions, silicon ions, phosphorus ions, or sulfur ions.

Then, an epitaxial growth step is carried out as step (S40). In this step (S40), referring to FIG. 6, in an atmosphere having hydrogen ($H_2$) gas, methane ($CH_4$) gas and nitrogen ($N_2$) gas introduced thereinto, an epitaxial growth layer 43 made of a single crystal diamond is formed on surface 40a (on conductive layer 42) by the microwave plasma CVD method. The method of forming epitaxial growth layer 43 is not limited to the microwave plasma CVD method, but may be the hot-filament CVD method or the DC plasma method, for example.

In this step (S40), ethane gas or gas containing other carbon atoms may be used in place of methane gas. Furthermore, surface 40a forming epitaxial growth layer 43 is preferably a (100) plane, and more preferably, a plane having an off-angle of 0.5° or more and 0.7° or less with respect to the (100) plane.

Furthermore, in this step (S40), it is preferable that the end face of single crystal substrate 40 does not protrude during plasma processing. This is because, in the case where the end face of the substrate protrudes during plasma processing, the crystal growth rate is higher in an end portion of the substrate than in a center portion thereof, which leads to a growth surface formed in a concave shape, with the result that it becomes difficult to form single crystal diamond 10 in which an abrupt change in transmittance is suppressed. In order to prevent the end face of the substrate from protruding during plasma processing in this way, it is preferable that another member (for example, a holder, a dummy substrate on a holder, or the like) is arranged around single crystal substrate 40. It is preferable that single crystal substrate 40 and this another member are arranged at a distance from each other. This distance is preferably less than 2.5 mm, and more preferably less than 1.5 mm. Furthermore, single crystal substrate 40 and another member do not necessarily need to have the same height. However, when another member is higher than single crystal substrate 40, it is preferable that the height difference therebetween is less than 1 mm.

Furthermore, in this step (S40), epitaxial growth layer 43 is formed while thickness variation is suppressed. More specifically, referring to FIG. 6, epitaxial growth layer 43 is formed such that a thickness $D_1$ of a portion including the center area of epitaxial growth layer 43 is equal to or greater than a thickness $D_2$ of a portion including the end face of epitaxial growth layer 43, and preferably such that 0.97 $D_1 \geq D_2$, and more preferably 0.92 $D_1 \geq D_2$. By suppressing formation of a protuberance in the end face portion in this way, it becomes possible to grow single crystal diamond 10 (epitaxial growth layer 43) described above in which an abrupt transmittance change is suppressed.

Figure 7:
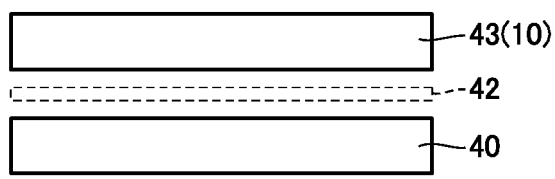
FIG. 7 is a schematic diagram for illustrating the step (S50) in the method of manufacturing a single crystal diamond according to the present embodiment.

Then, a separation step is carried out as step (S50). In this step (S50), referring to FIG. 7, conductive layer 42 is electrochemically etched, so that single crystal substrate 40 and epitaxial growth layer 43 are separated. In this way, single crystal diamond 10 (epitaxial growth layer 43) is obtained. Also, the separation method is not limited to electrochemical etching, but may be slicing using a laser beam, for example. In this case, the ion implantation step (S30) described above can be eliminated. By performing the steps (S10) to (S50) as described above, single crystal diamond 10 is produced, and thus, the method of manufacturing a single crystal diamond according to the present embodiment is completed.

It is useful to produce a cutting tool by utilizing single crystal diamond 10 according to the present embodiment. This is particularly effective in the case of a tool having a narrowed tip since chipping and grinding scratches onto a workpiece material are less likely to occur even during a long-term use; and more specifically, particularly effective in the case of a tool having a tip with a cutting edge set at an open angle of 45° or less, and further, at an acute angle of 30° or less when the rake face is viewed from the upper surface. Furthermore, it is also effective to produce a cutting tool by utilizing single crystal diamond 10 according to the present embodiment in the case of a tool that comes in contact with a workpiece material for a distance of 200 μm or more, and further, 400 μm or more; and also effective in the case of a tool configured such that the angle between the rake face and the flank face is set at 75° or less, and further, at an acute angle of 60° or less. Single crystal diamond 10 according to the present embodiment is made of a material that is less likely to be chipped and suitable to a cutting tool, and therefore, particularly suitable to a cutting tool having a characteristic shape as described above.

EXAMPLES

Production of Single Crystal Diamond

Experiments were carried out for confirming the effect of the present invention upon the performance of the diamond tool made using a single crystal diamond. First, single crystal diamond 10 was produced by using the method of producing a single crystal diamond according to the present embodiment described above (see FIGS. 3 to 7). In step (S10), single crystal substrate 40 having a thickness of 0.7 mm and a distance (width) between side surfaces 40b of 1 mm to 9 mm was prepared (see FIG. 4).

In step (S20), single crystal substrate 40 was etched by ME from surface 40a to a depth region of 0.3 μm, or etched by sputtering from surface 40a to a depth region of 0.3 μm (see FIG. 4). In step (S30), carbon ions were implanted with ion implantation energy of 300 keV to 350 keV and at a dose amount of $5 \times 10^{15}$ to $5 \times 10^{17}$ pieces/cm$^2$, thereby forming conductive layer 42 (see FIG. 5).

Figure 6:
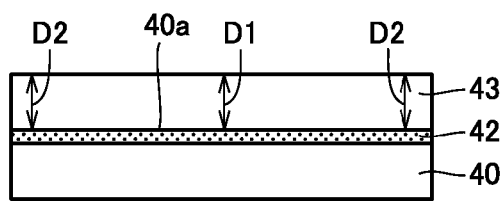
FIG. 6 is a schematic diagram for illustrating the step (S40) in the method of manufacturing a single crystal diamond according to the present embodiment.

In step (S40), epitaxial growth layer 43 having a thickness of 0.7 mm was grown (see FIG. 6). Using hydrogen gas, methane gas and nitrogen gas, the concentration of methane gas to hydrogen gas was set at 5% to 20%, and the concentration of nitrogen gas to methane gas was set at 0.5% to 4%. The pressure was set at 9.3 kPa to 14.7 kPa, and the substrate temperature was set at 800° C. to 1100° C. By carrying out the steps (S10) to (S50) in this way, single crystal diamond 10 according to the present embodiment (an example) described above was obtained. The conventional single crystal diamond was also prepared as a comparative example.

Transmittance Measurement

First, transmittance was measured for a single crystal diamond in each of the example and the comparative example as in the following manner. Referring to FIG. 2, first, measurement region 20 having a plurality of square regions 20a (0.2 mm×0.2 mm) arranged continuously in a linear shape was defined in surface 10a. This measurement region 20 was defined so as to include a portion exhibiting a transmittance that is highest in the single crystal diamond and a portion exhibiting a transmittance that is lowest in the single crystal diamond in each of the example and the comparative example described above. Then, the plurality of (three or four) continuously arranged square regions 20a were selected, and the average value of transmittances was measured in each of selected square regions 20a.

When measuring the average value of the transmittances in each of four square regions 20a in the single crystal diamond of the example, the results showed 68.1(%), 67.1(%), 64.9(%), and 64.7%). When calculating the value of $((T_1-T_2)/((T_1+T_2)/2) \times 100)/0.2$ (%/mm) based on these results, the results showed 7.4(%/mm), 16.7 (%/mm) and 1.5(%/mm). Also, when measuring the average value of transmittances in each of three square regions 20a in the single crystal diamond of the comparative example, the results showed 47.3(%), 45.5(%) and 42.9(%). When calculating the value of $((T_1-T_2)/((T_1+T_2)/2) \times 100)/0.2$ based on these results, the results showed 19.9(%/mm) and 29.3 (%/mm). It was found based on these results that the value of $((T_1-T_2)/((T_1+T_2)/2) \times 100)/0.2$ exceeded 20(%/mm) in the comparative example, whereas the value of $((T_1-T_2)/((T_1+T_2)/2) \times 100)/0.2$ fell within 20(%/mm) in the example.

Furthermore, transmittance measurement as described below was also carried out for the single crystal diamond in each of the example and the comparative example. Referring to FIG. 2, square region 30 (1 mm×1 mm or 0.5 mm×0.5 mm) was first defined in surface 10a. Then, transmittances were measured in square region 30 to obtain a frequency distribution of the transmittances in square region 30. As a result, two peaks were confirmed in the frequency distribution of the transmittances in the comparative example, whereas only one peak was confirmed in the frequency distribution of the transmittances in the example.

Tool Performance Evaluation

Then, single crystal diamonds in the example and the comparative example were used to produce diamond bits, which each were then used to perform a process of grinding a workpiece material. Then, the surface states of the workpiece materials after the process were checked. As a result, scratches were confirmed on the workpiece material in the comparative example, whereas no scratch was confirmed on the workpiece material in the example. It was found based on this result that the tool performance was improved in the case of a diamond tool produced using a single crystal diamond into which impurities and defects were introduced in a controlled manner so as to satisfy the relation of $((T_1-T_2)/((T_1+T_2)/2)\times100)/0.2\leq20(\%/mm)$ (so as to suppress an abrupt change in the transmittance).

It should be understood that the embodiments and examples disclosed herein are illustrative and non-restrictive in every respect. The scope of the present invention is defined by the terms of the claims, rather than the description above, and is intended to include any modifications within the meaning and scope equivalent to the terms of the claims.

INDUSTRIAL APPLICABILITY

A single crystal diamond and a diamond tool according to the present invention are particularly advantageously applied in a single crystal diamond into which impurities and defects need to be introduced in a controlled manner, and a diamond tool required to have an improved tool performance.

REFERENCE SIGNS LIST 1 diamond bit, 2 base metal, 3 brazing layer, 4 metallized layer, 10 single crystal diamond, 10a, 40a surface, 10b rake face, 10c flank face, 10d cutting edge, 20 measurement region, 20a, 30 square region, 40 single crystal substrate, 40b side surface, 42 conductive layer, 43 epitaxial growth layer, D1, D2 thickness.

The invention claimed is:

1. A single crystal diamond having a surface,
a measurement region within the single crystal diamond being defined in said surface, said measurement region having a plurality of first square regions that are continuously arranged and each have a side having a length of 0.2 mm, said measurement region including a portion exhibiting a transmittance that is highest in said single crystal diamond and a portion exhibiting a transmittance that is lowest in said single crystal diamond, and an average value of said transmittances in each of said plurality of first square regions being measured, wherein assuming that the average value of said transmittances in one first square region of said first square regions is defined as T1 and the average value of said transmittances in another first square region adjacent to said one first square region is defined as T2, a relation of $((T_1-T_2)/((T_1+T_2)/2)\times100)/0.2\leq20$ (%/mm) is satisfied throughout said measurement region.

2. The single crystal diamond according to claim 1, wherein said first square regions are arranged continuously in a linear shape in said measurement region.

3. The single crystal diamond according to claim 1, wherein in a case where a second square region having a side having a length of 0.5 mm or 1 mm is defined in said surface, and said transmittances are measured in said second square region, a single peak exists in a frequency distribution of said transmittances measured in said second square region.

4. The single crystal diamond according to claim 1, wherein said transmittances are measured in a state where said single crystal diamond is irradiated with light having a wavelength of 550 nm or 800 nm.

5. The single crystal diamond according to claim 1, wherein said single crystal diamond is formed by a vapor phase synthesis method.

6. A diamond tool comprising;
a base metal; and
the single crystal diamond according to claim 1, the single crystal diamond being fixed to the base metal.

7. A diamond tool including the single crystal diamond according to claim 1.

* * * * *